(12) United States Patent
von Kaenel

(10) Patent No.: US 7,268,633 B2
(45) Date of Patent: Sep. 11, 2007

(54) VOLTAGE-CONTROLLED OSCILLATOR FOR LOW-VOLTAGE, WIDE FREQUENCY RANGE OPERATION

(75) Inventor: Vincent R. von Kaenel, Palo Alto, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 110 days.

(21) Appl. No.: 11/224,256

(22) Filed: Sep. 12, 2005

(65) Prior Publication Data

US 2007/0057735 A1  Mar. 15, 2007

(51) Int. Cl.
*H03L 7/00* (2006.01)
(52) U.S. Cl. ............................ 331/17; 331/16; 331/34; 331/177 R
(58) Field of Classification Search ............... 331/17, 331/34, 177 R, 16
See application file for complete search history.

(56) References Cited

U.S. PATENT DOCUMENTS

| | | | |
|---|---|---|---|
| 3,882,412 A * | 5/1975 | Apple, Jr. ............... | 331/1 A |
| 5,136,260 A * | 8/1992 | Yousefi-Elezei ............. | 331/17 |
| 5,559,473 A | 9/1996 | Anderson et al. | |
| 5,673,008 A | 9/1997 | Sumita | |
| 5,864,258 A | 1/1999 | Cusinato et al. | |
| 6,188,289 B1 * | 2/2001 | Hyeon ........................ | 331/17 |
| 6,466,096 B1 * | 10/2002 | DeVito ....................... | 331/11 |
| 6,624,706 B2 * | 9/2003 | Higashi et al. ............... | 331/17 |
| 6,842,079 B2 | 1/2005 | Ingino, Jr. | |
| 7,002,420 B2 | 2/2006 | Ngo | |

* cited by examiner

*Primary Examiner*—Benny Lee
*Assistant Examiner*—Levi Gannon
(74) *Attorney, Agent, or Firm*—Lawrence J. Markel; Meyertons, Hood, Kivlin, Kowert & Goetzel, P.C.

(57) ABSTRACT

In one embodiment, an apparatus comprises a voltage-controlled oscillator (VCO) that comprises a circuit coupled to receive an input control voltage to the VCO and configured to generate a second voltage responsive to the input control voltage, a summator coupled to receive the input control voltage and the second voltage, and an oscillator coupled to receive the output voltage of the summator. The summator is configured to combine the input control voltage and the second voltage to generate the output voltage. The oscillator is configured to oscillate an output signal, wherein a frequency of oscillation of the output signal is controlled by the output voltage of the summator.

22 Claims, 3 Drawing Sheets

VOLTAGE-CONTROLLED OSCILLATOR FOR LOW-VOLTAGE, WIDE FREQUENCY RANGE OPERATION

BACKGROUND

1. Field of the Invention

This invention is related to the field of voltage-controlled oscillators.

2. Description of the Related Art

A voltage-controlled oscillator (VCO) comprises circuitry that receives a control voltage and outputs an oscillating signal having a frequency that is controlled by the magnitude of the control voltage. VCOs have a variety of uses in electronics. For example, VCOs are frequently a component of phase-locked loops (PLLs), which are often used to generate clocks in integrated circuits. The output of the VCO is the clock signal used in the integrated circuit, and the control voltage may be generated by other circuitry in the PLL to phase lock the clock signal to an input reference clock.

As the process features (e.g. channel length, oxide thickness, etc.) of integrated circuit manufacturing processes have continued to shrink over time, the magnitude of the supply voltage provided to the integrated circuit has also been shrinking. Presently, supply voltage magnitudes of around 1 volt are being used, and supply voltage magnitudes less than 1 volt are possible. Additionally, the operating frequency of the integrated circuits has continued to increase. Still further, wide ranges of operating frequencies are being supported in many integrated circuits (e.g. to permit lower frequency operation during periods of lower activity, for power management reasons). Accordingly, the range of frequencies that the VCO in a PLL must support is large, and the range of the control voltage (bounded by ground and the supply voltage) is small. A high gain (in terms of frequency/volt) VCO is thus required.

Unfortunately, a high gain VCO provides large frequency changes in response to small changes in the control voltage, which contributes to the "jitter" experienced on a PLL-generated clock when the clock is phase-locked. Even when the clock is phase-locked, small changes in the control voltage may be expected as the circuit reacts to various transient conditions, noise, etc. These small changes, in a high gain VCO, may produce undesirable amounts of jitter.

In some PLLs, multiple VCOs are included. Each VCO has a different subrange within the desired frequency range, and thus can have a lower gain within its frequency range. Using multiple VCOs increases the size of the PLL. Typically, the subranges must be overlapped to ensure that any frequency can be adequately supported, further increasing the size for a desired frequency range for the PLL. Additionally, switching between VCOs must be supported as the operating frequency of the integrated circuit changes. Accordingly, the frequency range of such a VCO is not truly continuous.

In other PLLs, a single VCO may be used with a programmable frequency range. For example, the VCO may have a register or input control signals which identify the desired range. Again, the frequency range of the PLL is not truly continuous since the programming of the VCO must be explicitly changed (e.g. by software) as the desired frequency for the PLL is changed.

SUMMARY

In one embodiment, an apparatus comprises a voltage-controlled oscillator (VCO) that comprises a circuit coupled to receive an input control voltage to the VCO and configured to generate a second voltage responsive to the input control voltage, a summator coupled to receive the input control voltage and the second voltage, and an oscillator coupled to receive the output voltage of the summator. The summator is configured to combine the input control voltage and the second voltage to generate the output voltage. The oscillator is configured to oscillate an output signal, wherein a frequency of oscillation of the output signal is controlled by the output voltage of the summator.

In another embodiment, a method is contemplated. An input control voltage is received in a VCO. A second voltage is generated responsive to the input control voltage. The input control voltage and the second voltage are combined to generate an output voltage. The VCO oscillates at a frequency that is dependent on the output voltage.

BRIEF DESCRIPTION OF THE DRAWINGS

The following detailed description makes reference to the accompanying drawings, which are now briefly described.

Figure 1:
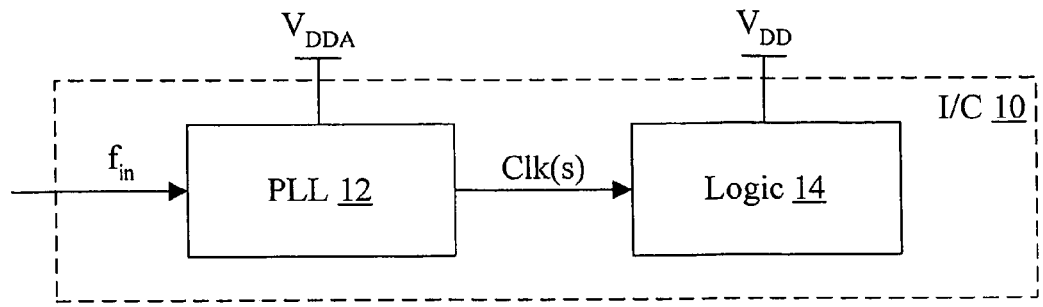
FIG. 1 is a block diagram of one embodiment of an integrated circuit including a phase-locked loop (PLL).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit (I/C) 10 is shown. In the illustrated embodiment, the integrated circuit 10 includes a PLL 12 and logic circuitry 14. The PLL 12 is coupled to receive a reference frequency ($f_{in}$) supplied to the integrated circuit 10, and is coupled to provide one or more clocks (Clk(s)) to the logic 14. The PLL 12 is supplied by an analog supply voltage ($V_{DDA}$), while the logic is supplied by a separate supply voltage ($V_{DD}$). The $V_{DDA}$ and $V_{DD}$ may have approximately the same magnitude during operation, but a separate analog supply voltage is often provided to insulate the analog circuitry in the PLL from the digital supply voltage. The digital supply voltage is typically noisier due to the high load and large current swings that often occur in digital logic. In the illustrated embodiment, the PLL 12 and the logic 14 are integrated onto a single semiconductor substrate as the integrated circuit 10, although other embodiments may employ discrete components, as desired.

The logic 14 may generally comprise circuitry that implements the operation for which the integrated circuit 10 is designed. For example, the logic 14 may implement a processor that is configured to execute instructions stored in memory and operate on data stored in memory. Alternatively, the logic 14 may implement input/output (I/O) circuitry, other peripheral circuitry, I/O bridges, hubs, special purpose circuitry, etc., or combinations of one or more processors and any of the above. The logic 14 may generally include various clocked storage devices and other clock-controlled circuitry that uses the clock or clocks supplied by the PLL 12.

The PLL 12 generates the clock or clocks at the desired frequency or frequencies for the logic 14. The PLL 12 may phase lock the generated clocks to the reference frequency $f_{in}$. While one PLL 12 is shown in FIG. 1, other embodiments may include multiple PLLs, if desired.

Figure 2:
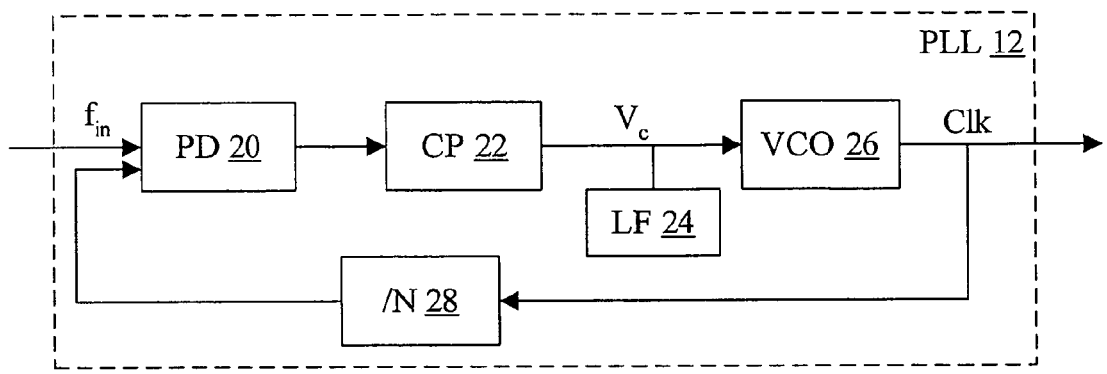
FIG. 2 is a block diagram of one embodiment of a PLL shown in FIG. 1, including a voltage controlled oscillator (VCO).

FIG. 2 is a block diagram of one embodiment of the PLL 12. In the illustrated embodiment, the PLL 12 includes a phase detector (PD) 20, a charge pump (CP) 22, a loop filter (LF) 24, a VCO 26, and a divide by N circuit 28. The phase detector 20 is coupled to receive the reference frequency $f_{in}$ and the output of the divide by N circuit 28, and is coupled to the charge pump 22. The charge pump 22 generates the control voltage ($V_c$) for the VCO 26, to which the charge pump 22 is coupled. The loop filter 24 is coupled to the $V_c$ node as well. The output of the VCO 26 is one of the clocks provided to the logic 14, and is also coupled as the input to the divide by N circuit 28.

The phase detector 20 is configured to detect a phase mismatch between the reference frequency and the output of the divide by N circuit 28, and is configured to control the charge pump 22 according to the detected phase mismatch. For example, if the output of the divide by N circuit 28 lags the reference frequency, the phase detector 20 may control the charge pump 22 to increase the control voltage $V_c$ (thus increasing the frequency of the VCO output clock, thereby increasing the frequency of the output of the divide by N circuit 28). If the output of the divide by N circuit 28 leads the reference frequency, the phase detector 20 may control the charge pump 22 to decrease the control voltage $V_c$ (thus decreasing the frequency of the VCO output clock, thereby decreasing the frequency of the output of the divide by N circuit 28). In one implementation, the phase detector 20 may include up and down control signals to the charge pump 22, and may assert the up signal to increase the control voltage and assert the down signal to decrease the control voltage. The charge pump 22 comprises circuitry configured to generate the control voltage $V_c$ responsive to the inputs from the phase detector. The VCO 26 generates the output clock responsive to the control voltage $V_c$. The divide by N circuit 28 divides the frequency of the output clock from the VCO 26 by a factor of N to provide the clock for phase comparison to the reference frequency. Accordingly, the clock generated by the VCO 26 may have a frequency of $N*f_{in}$. The divide by N circuit 28 may be programmable to select the desired frequency multiplication. The loop filter 24 may include circuitry configured to filter high frequency components of the $V_c$ signal, to provide stability in the PLL 12. The loop filter 24 may be characterized by a time constant (e.g. the equivalent resistance-capacitance (RC) delay of the loop filter 24), which may be a measure of the reaction time of the PLL 12. Lower time constants correspond to more rapid PLL reactions to changes in conditions, but may also be less stable in the presence of noise influences. Higher time constants correspond to slower PLL reactions and higher stability. Any time constant may be used in various loop filter embodiments.

It is noted that, while the VCO 26 generates one output clock in the present embodiment, it is contemplated that multiple output clocks may be generated. For example, clock divider or multiplier circuits may be used to generate clocks that have a frequency that is a multiple or fraction of the frequency of the output of the VCO 26. Also, the output of the VCO 26 may be buffered, in some embodiments, to produce the output clock(s).

Figure 3:
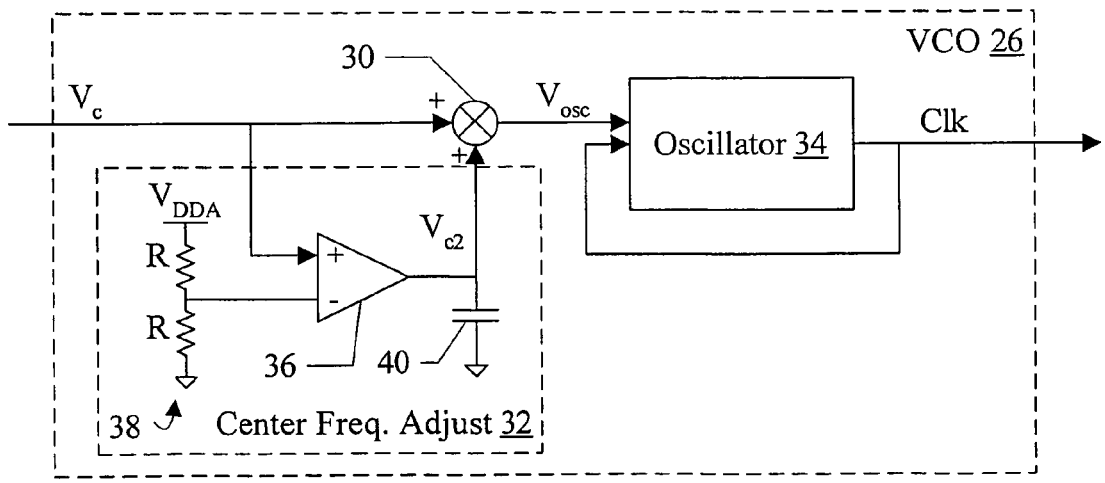
FIG. 3 is a circuit diagram of one embodiment of the VCO shown in FIG. 1.

Turning now to FIG. 3, a circuit diagram of one embodiment of the VCO 26 is shown. In the illustrated embodiment, the VCO 26 includes an analog summation block (summator) 30, a center frequency adjustment circuit 32, and an oscillator 34. The summator 30 and the center frequency adjustment circuit 32 are coupled to receive the input control voltage $V_c$ to the VCO 26. The summator 30 is further coupled to receive a second voltage $V_{c2}$ from the center frequency adjustment circuit 32, and is configured to provide an output voltage $V_{OSC}$ to the oscillator 34. The oscillator 34 is configured to oscillate an output signal, which may be the output clock from the VCO 26. The output of the oscillator 34 is coupled to its input as well, in the illustrated embodiment.

The VCO 26 may have a "center frequency", which may be the center of the frequency range of the VCO 26. That is, one half of the frequency range may be above the center frequency and one half of the frequency range may be below the center frequency. The center frequency may be the frequency of the output of the VCO 26 when the input control voltage $V_c$ is at about one half of the supply voltage $V_{DDA}$. In one embodiment, the VCO 26 may dynamically adjust the center frequency to be the desired output frequency of the VCO 26. That is, the VCO 26 may include circuitry that continuously adjusts the center frequency until the control voltage $V_c$ stabilizes at about one half of the supply voltage. Thus, the VCO 26 may have a relatively low gain, sufficient to react to small changes in the control voltage $V_c$ around the center frequency (e.g. to maintain lock of the output clock to the reference frequency $f_{in}$ in a PLL).

The center frequency adjust circuit 32 may receive the control voltage $V_c$ and may generate the voltage $V_{c2}$ responsive to the control voltage. In one embodiment, the center frequency adjust circuit 32 may generate the voltage $V_{c2}$ to adjust the center frequency of the VCO 26 until the control voltage $V_c$ has stabilized (which, in a PLL, means that lock has been reached for the output clock) at about one half the supply voltage $V_{DDA}$. Generally, if the control voltage $V_c$ is greater than $V_{DDA}/2$, the center frequency adjust circuit 32 may increase the voltage $V_{c2}$ to increase the center frequency. If the control voltage $V_c$ is less than $V_{DDA}/2$, the center frequency adjust circuit 32 may decrease the voltage $V_{c2}$ to decrease the center frequency.

Figure 4:
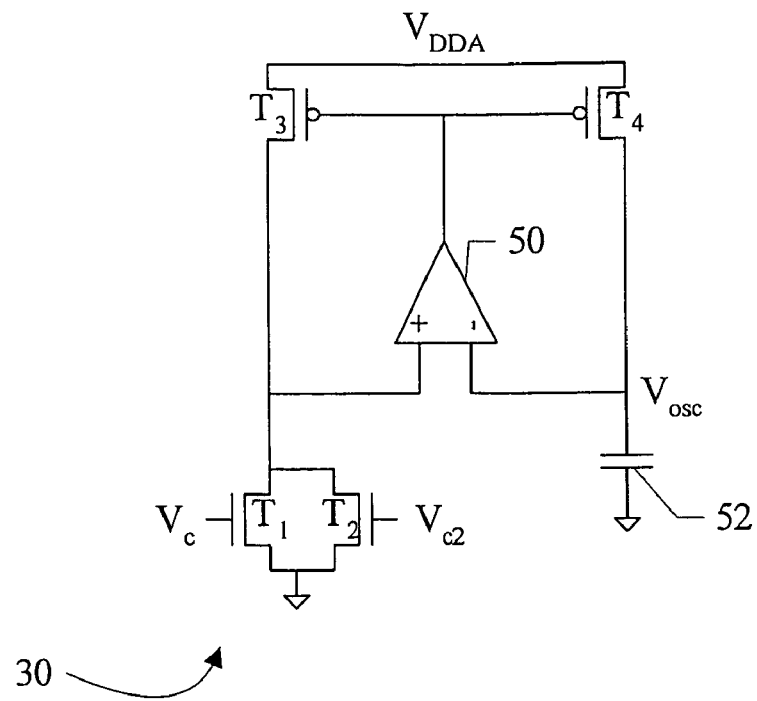
FIG. 4 is a circuit diagram of one embodiment of a summator shown in FIG. 3.
Figure 5:
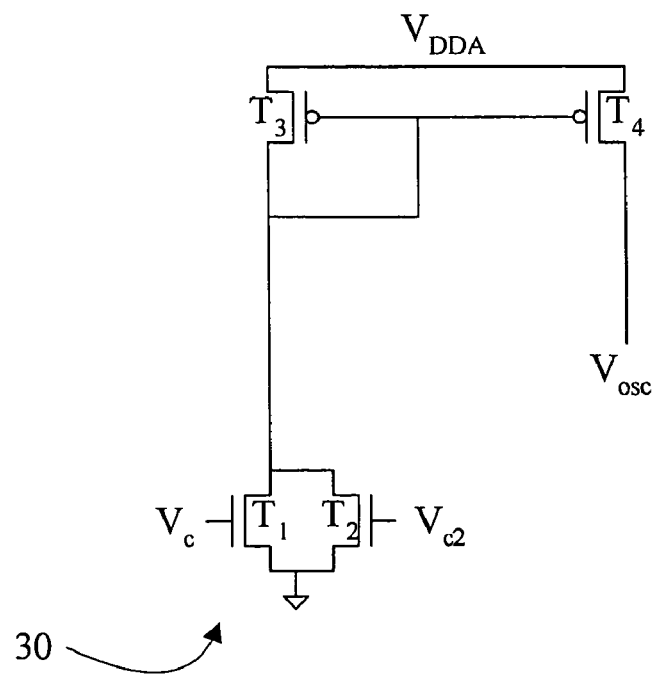
FIG. 5 is a circuit diagram of one embodiment of a summator shown in FIG. 3.

The summator 30 receives the control voltage $V_c$ and the voltage $V_{c2}$ and combines the voltages to generate the voltage $V_{OSC}$ to the oscillator 34. As illustrated in FIG. 3, the combination may be an additive combination. Thus, as the voltage $V_{c2}$ increases, the voltage $V_{OSC}$ increases even if the control voltage $V_c$ has not increased. The output frequency of the oscillator 34 thus increases. If the control voltage $V_c$ has stabilized due to a lock in the PLL 12, the control voltage $V_c$ would be decreased to reduce the output frequency of the VCO 26. Similarly, decreases in the voltage $V_{c2}$ result in decreases in the voltage $V_{OSC}$ even if the control voltage $V_c$ has not decreased. The output frequency of the oscillator 34 thus decreases. If the control voltage $V_c$ had stabilized due to a lock in the PLL 12, the control voltage $V_c$ would be increased to increase the output frequency of the VCO 26 to maintain lock. In one embodiment, the summator 30 may implement current summing to sum currents that are proportional to the control voltage $V_c$ and the voltage $V_{c2}$. Illustrative embodiments are shown in FIGS. 4 and 5 and described in more detail below.

In some embodiments, the center frequency adjust circuit 32/summator 30 may automatically account for variations in the VCO 26 due to process variation, centering the VCO 26 at the desired frequency. In some embodiments, the center frequency adjust circuit 32/summator 30 may permit a lower gain oscillator 34 than might otherwise be used, which may reduce jitter in a PLL such as PLL 12. In some embodiments, since the center frequency of the oscillator 34 is adjusted automatically to the desired frequency, a truly continuous frequency range may be supported by the VCO 26. That is, if the control voltage $V_c$ increases or decreases due to a change in the desired frequency, the center frequency adjust circuit 32 may adjust the center frequency to the newly desired frequency, causing the control voltage $V_c$ to return to one half of $V_{DDA}$.

In the illustrated embodiment, the center frequency adjust circuit 32 may include an operational amplifier (opamp) 36 having one input coupled to the input control voltage $V_c$ and the other input coupled to the output of a voltage divider 38. The voltage divider 38 may be designed to nominally output one half of $V_{DDA}$ to the opamp 36 (e.g. the resistors in the voltage divider may nominally have the same resistance). The output of the opamp 36 may be the voltage $V_{c2}$. A capacitor 40 is also provided to integrate the comparator output over time to produce the voltage $V_{c2}$. The capacitor 40 is coupled between the output of the opamp 36 and ground. Accordingly, over time, the center frequency adjust circuit 32 may vary the voltage $V_{c2}$ until the input control voltage $V_c$ stabilizes at one half of the supply voltage. The output of the opamp 36 may increase if the input control voltage $V_c$ is greater than one half of $V_{DDA}$ (output by the voltage divider 38) and may decrease if the input control voltage $V_c$ is less than one half of $V_{DDA}$.

The center frequency adjust circuit 32 may be characterized by a time constant, similar to the loop filter 24. The time constant of the center frequency adjust circuit 32 may be greater than the time constant of the loop filter 24, in some embodiments, to promote stability in the PLL 12. In some embodiments, the time constant of the center frequency adjust circuit 32 may be much greater than the time constant of the loop filter 24 (e.g. one or more orders of magnitude).

While the illustrated embodiment includes a capacitor 40, generally any filter may be used in the place of capacitor 40 to promote electrical stability in the VCO. The capacitor 40 may be an example of such a filter.

While the center frequency adjust circuit 32 is nominally designed to generate the voltage $V_{c2}$ to cause the input control voltage $V_c$ to settle at one half of the supply voltage, the actual operation of the circuit may vary in practice (e.g. due to various manufacturing process variations, variations due to temperature and noise, error in the circuit, etc.). Thus, the center frequency adjust circuit 32 may operate to cause the input control voltage $V_c$ to settle at about one half of the supply voltage. It is noted that, while the present embodiment has the voltage divider 38 output one half of the supply voltage for comparison to the input control voltage $V_c$, other embodiments may use other voltages if desired (e.g. by changing the resistances in the voltage divider 38 to achieve the desired fraction).

The oscillator 34 may have any design. For example, the oscillator 34 may be a ring oscillator having its output connected to its input. The oscillator 34 may comprise an odd number of inverting stages (e.g. inverter circuits may be used), with the output of the last stage coupled back to the input as the connection shown in FIG. 3. The voltage $V_{OSC}$ may be the supply voltage to the ring oscillator, and changing the voltage may change the frequency of oscillation of the output. That is, the frequency of oscillation of the oscillator 34 may be controlled by the voltage $V_{OSC}$.

While the VCO 26 is used in the embodiment of FIG. 2 as part of the PLL 12, other embodiments may use the VCO 26 in any desired circuitry.

FIG. 4 is a circuit diagram of one embodiment of the summator 30. The embodiment of the summator 30 shown in FIG. 4 may use current summing to sum currents proportional to the input control voltage $V_c$ and the voltage $V_{c2}$ to generate the output voltage $V_{OSC}$.

The current summing is performed via transistors $T_1$ and $T_2$ in the illustrated embodiment, which are negative channel metal-oxide-semiconductor (NMOS) transistors coupled in parallel, having their sources coupled to ground, and having gates coupled to receive the $V_c$ and $V_{c2}$ voltages, respectively. Each transistor $T_1$ and $T_2$ may conduct a current through its source and drain terminals that is proportional to the gate voltage, assuming that the voltage exceeds the threshold voltage of the transistor. The drains of the transistors $T_1$ and $T_2$ are coupled to the drain of the transistor $T_3$ and the positive input of a opamp 50. The opamp 50 may be an operational transconductance amplifier (OTA), in one embodiment, although any opamp may be used in various embodiments. The negative input of the opamp 50 is coupled to the non-grounded node of a capacitor 52 and the drain of the transistor $T_4$. The sources of the transistors $T_3$ and $T_4$ are coupled to the analog supply voltage $V_{DDA}$. The output of the opamp 50 is coupled to the gates of transistors $T_3$ and $T_4$, which are positive channel MOS (PMOS) transistors. The current sourced by transistor $T_3$ is sunk by the transistors $T_1$ and $T_2$, while the current sourced by transistor $T_4$ charges the capacitor 52. The non-grounded node of the capacitor 52 is the output voltage $V_{OSC}$ of the summator 30.

Thus, if the current through transistors $T_1$ and $T_2$ increases from a steady state condition for the summator 30, the voltage on the positive input of the opamp 50 decreases and the output of the opamp 50 decreases, causing more current to flow through the transistors $T_3$ and $T_4$ and increasing the voltage $V_{OSC}$. If the current through transistors $T_1$ and $T_2$ decreases from a steady state condition for the summator 30, the voltage on the positive input of the opamp 50 increases and the output of the opamp 50 increases, causing less current to flow through the transistors $T_3$ and $T_4$ and decreasing the voltage $V_{OSC}$.

FIG. 5 is a circuit diagram of another embodiment of the summator 30. The embodiment of the summator 30 shown in FIG. 5 may use current summing to sum currents proportional to the input control voltage $V_c$ and the voltage $V_{c2}$ to generate the output voltage $V_{OSC}$. Particularly, the transistors $T_1$ and $T_2$ may perform the current summing, similar to the discussion above. In the embodiment of FIG. 5, the summator 30 also includes a current mirror (transistors $T_3$ and $T_4$) that mirrors the current to the output node on which the voltage $V_{OSC}$ is provided. The current mirror converts the n-type current from the transistors $T_1$ and $T_2$ to p-type current suitable for providing a supply voltage to the oscillator 34.

Figure 6:
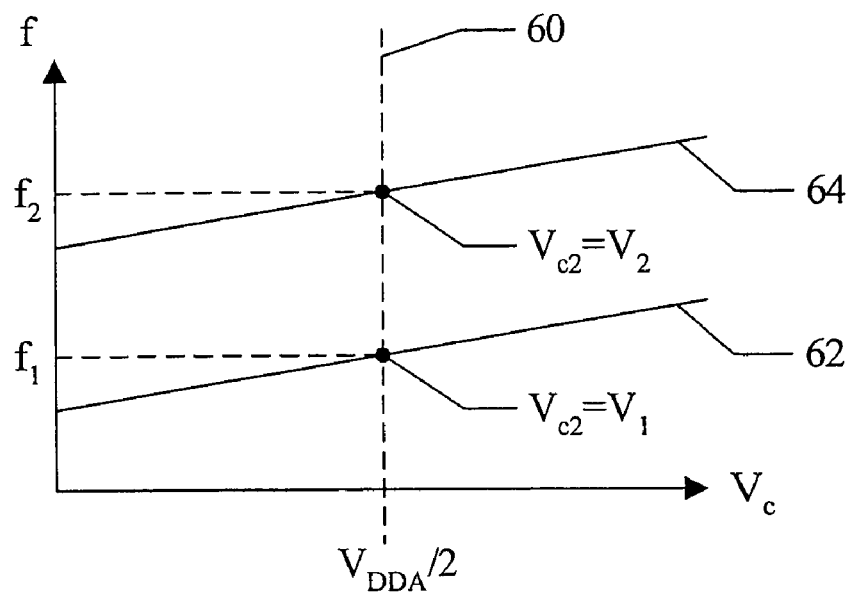
FIG. 6 is a graph illustrating frequency as a function of control voltage.

FIG. 6 is a graph of frequency (vertical axis) versus input control voltage $V_c$ (horizontal axis) for one embodiment of the VCO 26. A vertical dashed line 60 illustrates an input control voltage $V_c$ magnitude of $V_{DDA}/2$. The gain of the VCO 26 is illustrated via the solid lines 62 and 64.

Particularly, the line 62 may be the gain of the VCO 26 when the desired output frequency is $f_1$. The center frequency adjust circuit 32 may generate the voltage $V_{c2}$ to place the center frequency of the VCO 26 at $f_1$, as shown in FIG. 6. Once the PLL has stabilized at $f_1$, the input control voltage $V_{DDA}/2$ results in the frequency $f_1$, with a voltage $V_{c2}$ of $V_1$. At another time, the desired output frequency is $f_2$, wherein $f_2$ is greater than $f_1$. The center frequency adjust circuit 32 may generate the voltage $V_{c2}$ equal to $V_2$ (greater than $V_1$) to move the center frequency of the VCO to $f_2$. The gain of the VCO 26 as a function of $V_c$ is illustrated by the line 64. In a similar fashion, other frequencies may be supported by moving the value of $V_{c2}$ to center the frequency range of the VCO 26 at the desired frequency.

Figure 7:
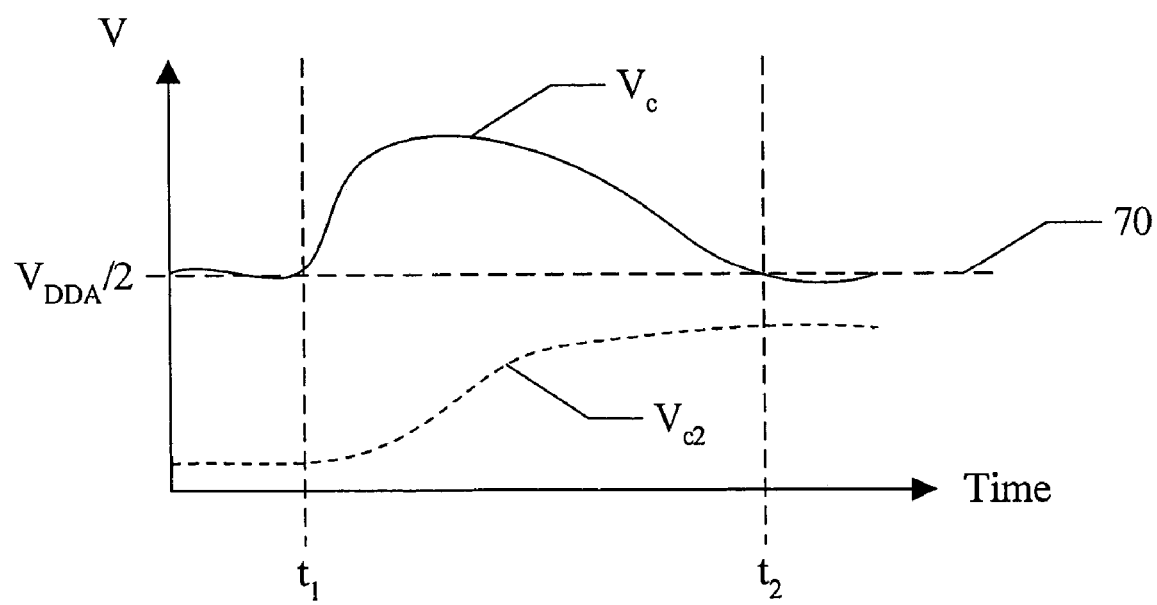
FIG. 7 is a graph illustrating an example of control voltage and compensation voltage operation.

FIG. 7 is a graph of voltages (vertical axis) versus time (horizontal axis) to illustrate changes in the voltages over time. $V_{DDA}/2$ is illustrated via a horizontal dashed line 70. The input control voltage $V_c$ is illustrated via a solid line in FIG. 7 and the voltage $V_{c2}$ is illustrated by a dashed line. Time is in arbitrary units in FIG. 7. FIG. 7 is intended merely to be exemplary and not necessarily accurate in time or in the relative reaction speeds of the input control voltage $V_c$ and the voltage $V_{c2}$.

At the left in FIG. 7, the input control voltage is fairly stable at approximately $V_{DDA}/2$, varying somewhat to react to small changes in conditions and to maintain the lock of the PLL 12. The voltage $V_{c2}$ is also relatively stable during this time period. At a time $t_1$ in FIG. 7, the frequency at which the PLL 12 is to lock is increased (e.g. by changing the divide by N circuit 28 parameters). The input control voltage $V_c$ rises relatively rapidly in FIG. 7 to attempt to lock at the new frequency. In response to the increased input control voltage $V_c$, and at a relatively slower rate, the voltage $V_{c2}$ increases. At a time $t_2$ in FIG. 7, the voltage $V_{c2}$ stabilizes at a higher voltage than before and the input control voltage $V_c$ again stabilizes at about $V_{DDA}/2$.

While the voltage $V_{c2}$ remains below $V_{DDA}/2$ in the example of FIG. 7, the voltage $V_{c2}$ may be greater than $V_{DDA}/2$ in other cases.

Numerous variations and modifications will become apparent to those skilled in the art once the above disclosure is fully appreciated. It is intended that the following claims be interpreted to embrace all such variations and modifications.

What is claimed is:

1. An apparatus comprising:
a voltage-controlled oscillator (VCO) comprising:
a circuit coupled to receive an input control voltage to the VCO and configured to generate a second voltage responsive to the input control voltage;
a summator coupled to receive the input control voltage and the second voltage, wherein the summator is configured to combine the input control voltage and the second voltage to generate an output voltage; and
an oscillator coupled to receive the output voltage of the summator and configured to oscillate an output signal, wherein a frequency of oscillation of the output signal is controlled by the output voltage of the summator; and the apparatus comprising a phase-locked loop (PLL) that includes the VCO, wherein the circuit is configured to generate the second voltage to cause the input control voltage to stabilize at about one half the supply voltage when the PLL is locked to a desired frequency.

2. The apparatus as recited in claim 1 wherein the oscillator comprises a ring oscillator having the output signal coupled as an input to the oscillator.

3. The apparatus as recited in claim 1 wherein the circuit comprises an operational amplifier having a first input coupled to receive the input control voltage and a second input coupled to a voltage divider coupled between a supply voltage and ground, wherein an output of the operational amplifier is the second voltage.

4. The apparatus as recited in claim 3 further comprising a filter coupled between an output of the operational amplifier and ground.

5. The apparatus as recited in claim 4 wherein the filter is a capacitor.

6. The apparatus as recited in claim 3 wherein the voltage divider is configured to generate a voltage on the second input of the operational amplifier that is about one half of the supply voltage.

7. The apparatus as recited in claim 1 wherein the PLL further comprises a phase detector, a charge pump, and a divide by N circuit wherein the charge pump is configured to generate the input control voltage to the VCO, and wherein the charge pump is controlled by the phase detector, which is coupled to receive a reference frequency and the output of the divide by N circuit, which is coupled to the output of the VCO.

8. The apparatus as recited in claim 7 wherein the PLL further comprises a loop filter coupled to the output of the charge pump and configured to filter the input control voltage.

9. The apparatus as recited in claim 8 wherein a time constant of the circuit is greater than a time constant of the loop filter.

10. An apparatus comprising:
a voltage-controlled oscillator (VCO) comprising:
a circuit coupled to receive an input control voltage to the VCO and configured to generate a second voltage responsive to the input control voltage;
a summator coupled to receive the input control voltage and the second voltage, wherein the summator is configured to combine the input control voltage and the second voltage to generate an output voltage, wherein the summator is configured to sum currents that are proportional to the input control voltage and the second voltage; and
an oscillator coupled to receive the output voltage of the summator and configured to oscillate an output signal, wherein a frequency of oscillation of the output signal is controlled by the output voltage of the summator.

11. The apparatus as recited in claim 10 wherein the summator comprises a current mirror coupled to receive the summed currents and configured to mirror the summed current on the output of the summator.

12. The apparatus as recited in claim 10 wherein the summator comprises an operational amplifier having a first input coupled to a first node on which the summed current is provided and a second input coupled to the output of the summator, wherein the summator further comprises a first positive channel metal oxide semiconductor (PMOS) transistor and a second PMOS transistor, wherein an output of the operational amplifier is coupled to a gate of the first and second PMOS transistors, and wherein a drain of the first PMOS transistor is coupled to the first node and wherein a drain of the second PMOS transistor is coupled to the output of the summator.

13. The apparatus as recited in claim 12 further comprising a capacitor coupled between an output of the summator and ground.

14. The apparatus as recited in claim 10 wherein the summator comprises a pair of parallel-coupled negative channel metal oxide semiconductor (NMOS) transistors, wherein one of the pair has a gate coupled to receive the input control voltage, and wherein a second one of the pair has a gate coupled to receive the second voltage, and wherein the pair of NMOS transistors are configured to generate the summed current.

15. A method comprising:
   receiving an input control voltage in a voltage-controlled oscillator (VCO);
   generating a second voltage responsive to the input control voltage;
   combining the input control voltage and the second voltage to generate an output voltage; and
   the VCO oscillating at a frequency that is dependent on the output voltage;
   wherein the VCO is included in a phase-locked loop (PLL), and wherein the second voltage is generated to cause the input control voltage to stabilize at about one half of a supply voltage when the PLL is locked at the desired frequency.

16. The method as recited in claim 15 wherein the generating comprises comparing the input control voltage to an output of a voltage divider, wherein a result of the comparison comprises the output voltage.

17. The method as recited in claim 15 further comprising generating the input control voltage in a charge pump in the PLL responsive to a phase detector in the PLL detecting a phase difference between a reference frequency input and an oscillating output of the VCO divided by a constant.

18. The method as recited in claim 15 wherein the combining comprises summing currents proportional to the input control voltage and the second voltage.

19. An apparatus comprising:
   a voltage-controlled oscillator (VCO) comprising:
      a circuit coupled to receive an input control voltage to the VCO and configured to generate a second voltage responsive to the input control voltage, wherein the circuit comprises an operational amplifier having a first input coupled to receive the input control voltage and a second input coupled to a voltage divider coupled between a supply voltage and ground, wherein an output of the operational amplifier is the second voltage;
      a summator coupled to receive the input control voltage and the second voltage, wherein the summator is configured to combine the input control voltage and the second voltage to generate an output voltage; and
      an oscillator coupled to receive the output voltage of the summator and configured to oscillate an output signal, wherein a frequency of oscillation of the output signal is controlled by the output voltage of the summator.

20. The apparatus as recited in claim 19 further comprising a filter coupled between an output of the operational amplifier and ground.

21. The apparatus as recited in claim 20 wherein the filter is a capacitor.

22. The apparatus as recited in claim 19 wherein the voltage divider is configured to generate a voltage on the second input of the operational amplifier that is about one half of the supply voltage.

* * * * *